US007143386B2

(12) United States Patent
Brown

(10) Patent No.: US 7,143,386 B2
(45) Date of Patent: Nov. 28, 2006

(54) TYPE CONFIGURABLE MEMORY METHODOLOGY FOR USE WITH METAL PROGRAMMABLE DEVICES

(75) Inventor: Jeffrey Scott Brown, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 455 days.

(21) Appl. No.: 10/643,463

(22) Filed: Aug. 19, 2003

(65) Prior Publication Data

US 2005/0041511 A1 Feb. 24, 2005

(51) Int. Cl.
*G06F 17/50* (2006.01)

(52) U.S. Cl. ............................ 716/17; 716/15; 716/16

(58) Field of Classification Search .................. 716/17, 716/16, 15

See application file for complete search history.

(56) References Cited

U.S. PATENT DOCUMENTS 6,864,716 B1 * 3/2005 Monzel et al. ................ 326/47
2003/0128050 A1 * 7/2003 Schultz ........................ 326/41
2004/0267517 A1 * 12/2004 Kedem ........................ 703/25

* cited by examiner

*Primary Examiner*—Vuthe Siek
*Assistant Examiner*—Tuyen To
(74) *Attorney, Agent, or Firm*—Yee & Associates, P.C.

(57) ABSTRACT

A pre-diffused array of core memory cells is provided in a metal programmable device. Multiple control block versions of interface logic are also provided and placed around the memory core. Contact points for each control block are brought to the surface of the wafer using a via. The appropriate interface logic is selected by connecting the metal layer to the appropriate surface contacts to access the core memory cells. The application-specific circuit, including memory configuration and memory interface type, is programmed with the metal layer.

18 Claims, 3 Drawing Sheets

130

Memory Interface

Memory Interface

Memory Core
110

Memory Interface

120

Memory Interface

Programmable Device
100

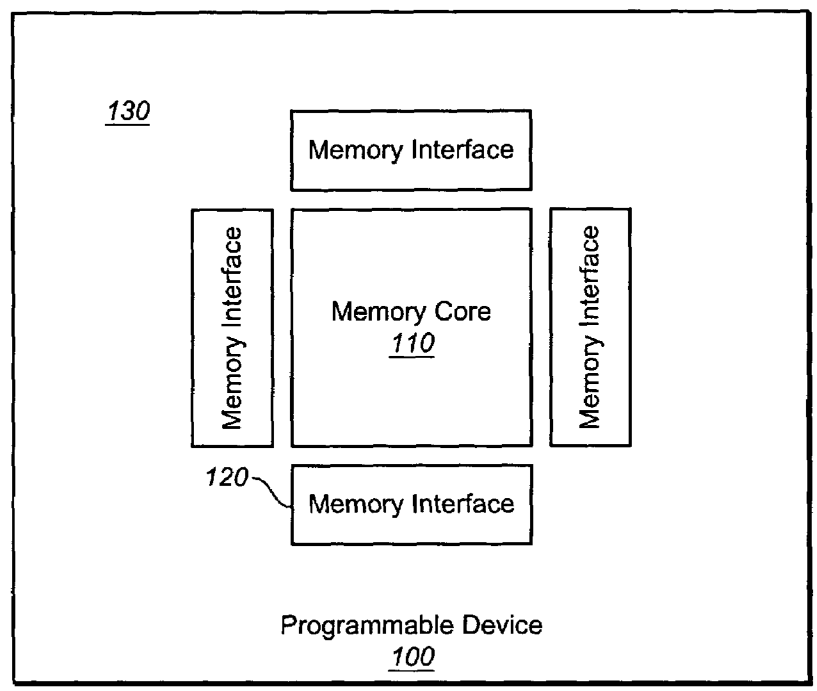
FIG._1A
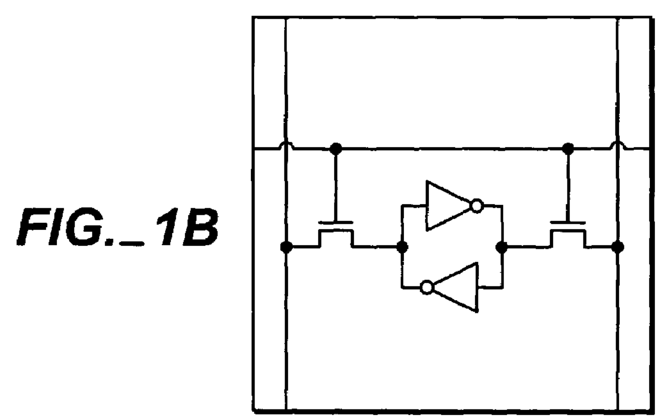
FIG._1B
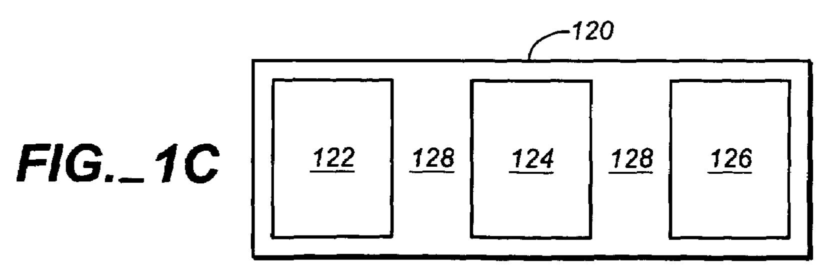
FIG._1C

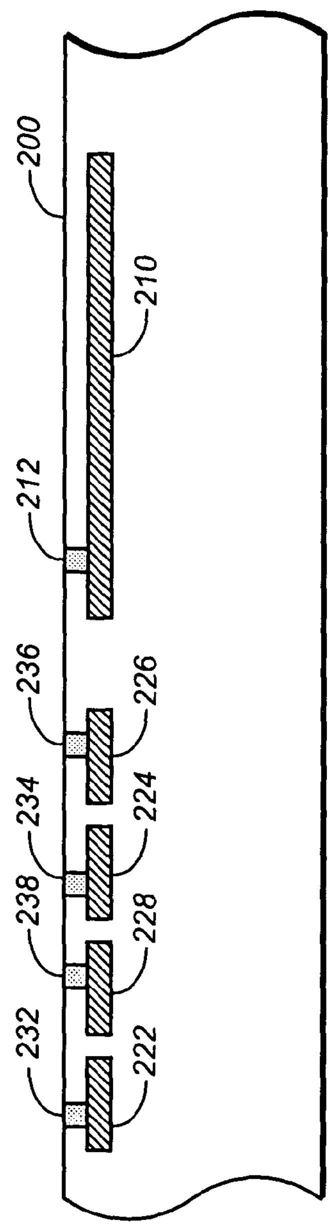
FIG._2A
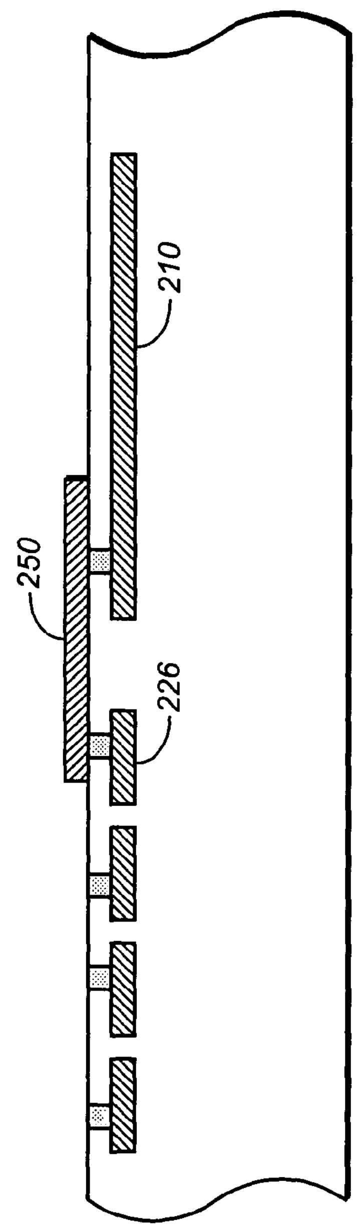
FIG._2B

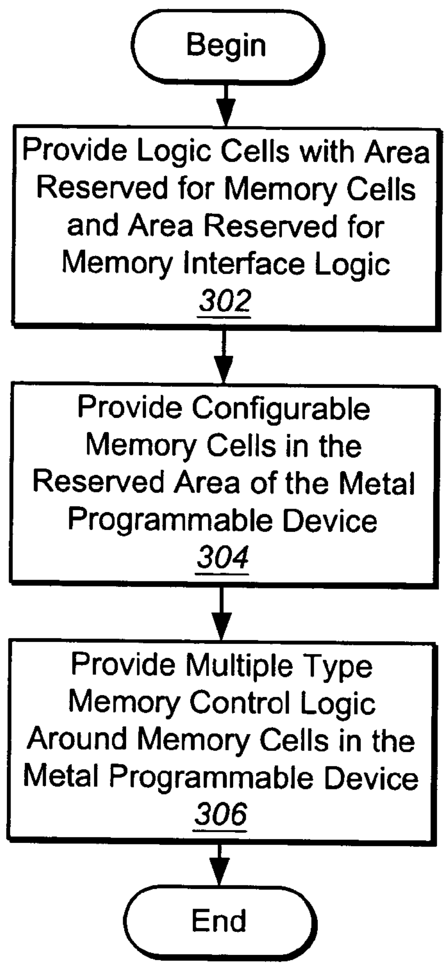
FIG._3
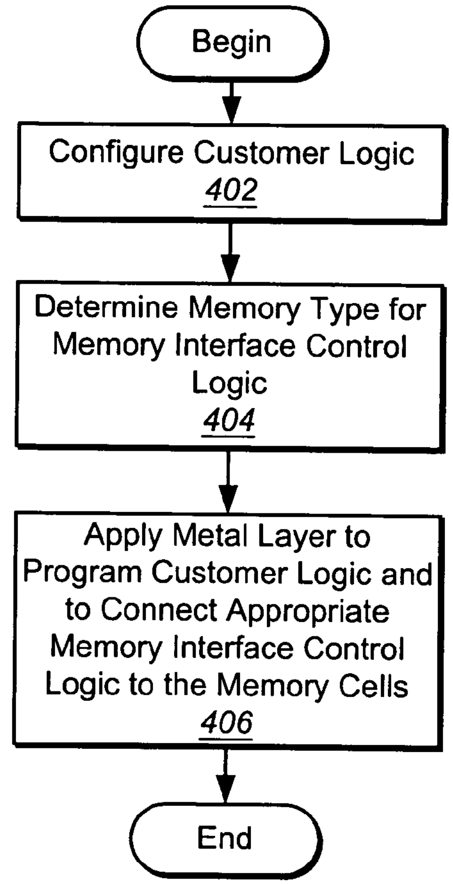
FIG._4

TYPE CONFIGURABLE MEMORY METHODOLOGY FOR USE WITH METAL PROGRAMMABLE DEVICES

BACKGROUND OF THE INVENTION

1. Technical Field

The present invention is directed generally toward metal programmable devices and, more particularly, to a method and apparatus for providing type configurable memory in a metal programmable device.

2. Description of the Related Art

In recent years, there has been a growth in products in which semi-custom techniques are used. Application-specific integrated circuits (ASIC) are widely used in consumer, manufacturing, communications, and amusement products, as well as other applications where a specific circuit may be needed. ASICs are very useful in bringing unique, customer-specific products to market on time.

The gate array is an example of an ASIC. Gate arrays are arrays of elements, such as AND or NAND gates, although today the term "gate array" usually refers to an array of transistors. These transistors can be tightly packed on an integrated circuit and later connected with a metal layer to form the application-specific circuit. These are referred to as metal programmable devices.

As gate array products became more sophisticated, it became necessary to form a memory in the circuit. Memory cells may be formed from the gate array transistors themselves. This approach is very flexible, because any number of memory cells of any type can be formed, within the area limitations in the gate array. However, each memory cell uses several transistors and a memory core may take up an undesirable amount of area and transistors in the gate array.

Another solution is to embed a memory in the gate array chip. Memory cells may be fabricated much more densely than memory cells formed from transistors in the gate array. Interface logic is also provided for the application-specific circuit to access the memory core. This solution allows much more memory to be provided in a smaller area. However, the type of memory is fixed in the gate array product. Therefore, if a single port memory is provided and the application-specific circuit requires a dual port memory, it will not be possible to produce the application-specific circuit with the gate array product.

Therefore, it would be advantageous to provide type configurable memory in a metal programmable device.

SUMMARY OF THE INVENTION

The present invention provides a pre-diffused array of core memory cells in a metal programmable device and multiple control block versions of interface logic. The memory interface logic is placed around the memory core. Contact points for each control block are brought to the surface of the wafer using a via. The appropriate interface logic is selected by connecting the metal layer to the appropriate surface contacts to access the core memory cells. The application-specific circuit, including memory configuration and memory interface type, is programmed with the metal layer.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 1A–1C, a block diagram of an example metal programmable device, is depicted in accordance with a preferred embodiment of the present invention;

FIGS. 2A and 2B, diagrams illustrating cross sections of a metal programmable device, are shown in accordance with an exemplary embodiment of the present invention;

FIG. 3 is a flowchart illustrating the operation of providing a metal programmable device with flexible embedded memory in accordance with a preferred embodiment of the present invention; and FIG. 4 shows a flowchart illustrating the operation of providing an application-specific circuit using the metal programmable device of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and in particular with reference to FIGS. 1A–1C, a block diagram of an example metal programmable device is depicted in accordance with a preferred embodiment of the present invention. More particularly, with reference to FIG. 1A, metal programmable device 100 includes gate array cells 130 and memory core array 110. In an exemplary embodiment, the gate array is made up of "Rcells." Each Rcell is a five-transistor cell, which includes two NMOS and two PMOS devices, and one small PMOS device. An application-specific circuit can be formed by programming the gate array cells with a metal layer. This circuit may use the memory core array to store and retrieve data.

The memory core is made up of versatile bitcells. An example of a versatile bitcell is the 6T static random access memory (SRAM) cell, as shown in FIG. 1B. Memory interface logic 120 is wrapped around the memory core. These multiple control logic versions may be used to access the memory as different types, using the same base bitcell. Each control block version will always be present around the memory core; however, only the desired memory interface(s) may be connected through upper level contact using metal programming.

FIG. 1C is a block diagram illustrating a memory interface logic in accordance with a preferred embodiment of the present invention. Memory interface logic 120 includes control blocks 122, 124, 126. Each control block includes components that are pre-diffused in the device. These control blocks include components that make up memory interface logic of different types. In the depicted example, three control blocks are shown; however, more or fewer control blocks may be included depending upon the implementation. Ideally, the memory interface logic will include as many control blocks as there are memory types supported by the base memory cell. Memory interface logic 120 may also include components in area 128 that are common to multiple control blocks. For example, all control blocks may share a set of sense amps or the like.

As an example, memory interface logic 122 may access the memory as a typical 6T single port SRAM with each access triggered on the rising edge of the clock. Memory interface logic 124 may access the memory as a pseudo 211 (dual port, single read port, single write port) type memory, performing a read on each rising edge of the clock and a write on each falling edge of the clock. The same memory cells may be accessed by memory interface logic 126 in a read only memory (ROM) mode where the 6T cells are also tied/programmed in an upper level layer using metal programming. Thus, in this example, if the customer logic calls for a single port memory, a metal layer may be applied to connect control block 122 to the memory core. Furthermore, any combinations of memory interface control blocks may be connected to the memory core to access subsets of the memory cells. Therefore, parts of the customer logic may access a first portion of the memory core as a first memory type and other parts of the customer logic may access a second portion of the memory core as a second type.

With reference to FIGS. 2A and 2B, diagrams illustrating cross sections of a metal programmable device are shown in accordance with an exemplary embodiment of the present invention. More particularly, with reference to FIG. 2A, substrate 200 includes components 222, 224, 226, 228 and memory cell 210. Connection to components 222–228 may be made through contacts 232, 234, 236, 238. Contact points are brought to the surface of the substrate using a via.

As an example, component 222 may belong to a first control block in a memory interface logic, component 224 may belong to a second control block, and component 226 may belong to a third control block. Component 228 may be common to two or more control blocks. For example, component 228 may be used by the first control block and the second control block. Contract 212 may be used to connect memory cell 210 to other components, particularly memory interface logic.

Turning to FIG. 2B, metal layer 250 connects component 226 to memory cell 210. Metal layer 250 may connect many other components within the memory interface logic. The metal layer provides a configuration of "painted" metal lines connecting device logic, interface logic, and/or memory cells. Using this metal layer, an application specific device may be configured from the programmable device of the present invention. Such a device may include a versatile memory core that may be accessed as different types of memory, depending upon the particular memory interface control blocks that are connected using the metal layer.

FIG. 3 is a flowchart illustrating the operation of providing a metal programmable device with flexible embedded memory in accordance with a preferred embodiment of the present invention. The process begins and provides logic cells with area reserved for memory cells and area reserved for memory interface logic (step 302). Then, the process provides configurable memory cells in the reserved area of the metal programmable device (step 304). Thereafter, the process provides multiple type memory control logic around the memory cells in the metal programmable device (step 306) and the process ends.

Next, FIG. 4 shows a flowchart illustrating the operation of providing an application-specific circuit using the metal programmable device of the present invention. The process begins and configures the customer logic (step 402). Then, the process determines a memory type for the memory interface control logic (step 404). Next, the process applies a metal layer to program the customer logic and to connect the appropriate memory interface control logic to the memory cells (step 406). Thereafter, the process ends.

Thus, the present invention solves the disadvantages of the prior art by providing a pre-diffused array of core memory cells in a metal programmable device and multiple control block versions of interface logic. The memory interface logic is placed around the memory core. Contact points for each control block are brought to the surface of the wafer using a via. The appropriate interface logic is selected by connecting the metal layer to the appropriate surface contacts to access the core memory cells. The application-specific circuit, including memory configuration and memory interface type, is programmed with the metal layer.

What is claimed is:

1. A method for providing a metal programmable device, the method comprising:

providing an array of programmable cells;

providing an array of pre-diffused memory cells;

providing a plurality of memory interface control blocks, wherein each memory interface control block accesses the pro-diffused memory cells as a different memory type; and connecting a first memory interface control block from within the plurality of memory interface control blocks to a first portion of the memory cells, wherein logic within the amy of programmable cells accesses at least a first portion of the array of pre-diffused memory cells as a first memory type using the first memory interface control block.

2. The method of claim 1, wherein the step of connecting the first memory interface control black to the memory cells is performed by applying a metal layer.

3. The method of claim 1, further comprising:

connecting a second memory interface control black from within the plurality of memory interface control blocks to a second portion of the memory cells, wherein logic within the array of programmable cells accesses at least a second portion of the array of pre-diffused memory cells as a second memory type using the second memory interface control block.

4. The method of claim 3, wherein the steps of connecting the second memory interface control block to the memory cells is performed by applying a metal layer.

5. The method of claim 1, wherein the array of pre-diffused memory cells is an array of 6T memory cells.

6. The method of claim 1, wherein the first memory interface control block and at least one other memory interface control block within the plurality of memory interface control blocks share components.

7. The method of claim 1, wherein the first memory type is one of a single part random access memory, a dual port random access memory, and a read only memory.

8. The method of claim 1, further comprising:

programming customer logic by applying a metal layer to the metal programmable device.

9. A metal programmable device, comprising:

an array of programmable cells;

an array of pre-diffused memory cells; and a plurality of memory interface control blocks, wherein each memory interface control block accesses the pre-diffused memory cells as a different memory type.

10. The metal programmable device of claim 9, further comprising:

a metal layer connecting a first memory interface control block from within the plurality of memory interface control blocks to a first portion of the memory cells, wherein logic within the array of programmable cells accesses the first portion of the memory cells as a first memory type using the first memory interface control block.

11. The metal programmable device of claim 10, wherein the metal layer connects a second memory interface control block from within the plurality of memory interface control blocks to a second portion of the memory cells and wherein logic within the array of programmable cells accesses at least a second portion of the memory cells as a second memory type using the second memory interface control block.

12. The metal programmable device of claim 10, wherein the first memory type is one of a single port random access memory, a dual port random access memory, and a read only memory.

13. The metal programmable device of claim 10, wherein the metal layer programs customer logic within the array of logic programmable cells.

14. The metal programmable device of claim 10, wherein the metal layer configures at least a portion of the plurality of pre-diffused memory cells.

15. The metal programmable device of claim 9, wherein the array of pre-diffused memory cells is an array of 6T memory cells.

16. The metal programmable device of claim 9, wherein the first memory interface control block and at least one other memory interface control block within the plurality of memory interface control blocks share components.

17. The metal programmable device of claim 9, wherein the plurality of memory interface control blocks are pre-diffused in the metal programmable device.

18. The metal programmable device of claim 9, wherein each memory interface control block within the plurality of memory interface control blocks has contact points on the surface of the metal programmable device.

* * * * *